United States Patent [19]

Sedding et al.

[11] Patent Number: 5,252,915

[45] Date of Patent: Oct. 12, 1993

[54] METHOD AND APPARATUS FOR DETECTING STATOR FAULTS IN ROTARY DYNAMOELECTRIC MACHINES

[75] Inventors: Howard G. Sedding, Toronto; Blake A. Lloyd, Mississauga, both of Canada; James Penman, Montrose, United Kingdom

[73] Assignee: Ontario Hydro, Toronto, Canada

[21] Appl. No.: 824,392

[22] Filed: Jan. 23, 1992

[51] Int. Cl.$^5$ .............................................. G01R 31/02
[52] U.S. Cl. ............................. 324/158 MG; 324/545
[58] Field of Search ............... 324/158 MG, 545, 546; 361/23

[56] References Cited

U.S. PATENT DOCUMENTS

| | | | |
|---|---|---|---|
| 4,136,312 | 1/1979 | Salon et al. | 324/158 MG |
| 4,145,653 | 3/1979 | Voigt | 324/158 MG |
| 4,230,961 | 10/1980 | Calfo et al. | 324/158 MG |
| 4,377,784 | 3/1983 | Saito et al. | 324/158 MG |
| 4,761,703 | 8/1988 | Kliman et al. | 324/545 |
| 4,808,932 | 2/1989 | Schulz, Jr. et al. | 324/158 MG |
| 4,851,766 | 7/1989 | Shiobara et al. | 324/158 MG |
| 4,884,023 | 11/1989 | Schmidt et al. | 324/158 MG |

FOREIGN PATENT DOCUMENTS 661430  5/1979  U.S.S.R. ........................... 324/545

OTHER PUBLICATIONS

J. Penman et al., —"Condition Monitoring of Electrical Drives" Proc. Inst. Electrical Engineers, Part B, vol. 133, No. 3, May 1986.

G. B. Kliman et al.—"Noninvasive Detection of Broken Rotor Bars in Operating Induction Motors"—1988 IEEE pp. 1-7.

Primary Examiner—Ernest F. Karlsen

[57] ABSTRACT

In order to determine the occurrence of a stator fault in an induction motor during operation of the motor, the axial leakage flux is monitored during operation of the motor. The occurrence of a stator fault is detected by observing a change in selected harmonic components of the axial leakage. The angular position of the fault with respect to a datum position is determined by noting and recording changes in the axial leakage flux at a plurality of positions distributed symmetrically around the axis of the motor and computing the angular position by triangulation. The axial leakage flux is detected by individual search coils located at said plurality of positions.

5 Claims, 5 Drawing Sheets

METHOD AND APPARATUS FOR DETECTING STATOR FAULTS IN ROTARY DYNAMOELECTRIC MACHINES

FIELD OF THE INVENTION

This invention relates to a method of detecting and locating stator faults in dynamoelectric machines during operation thereof, and to an apparatus for implementing the method. Specifically, the invention is concerned with the detection and location of a shorted turn of the stator winding by monitoring the axial leakage flux.

BACKGROUND OF THE INVENTION

Studies on reliability and failure mechanisms of dynamoelectric machines with multiturn stator coils indicate that stator insulation breakdown is one of the major causes of failure. Additionally there is evidence that the majority of stator winding failures in such machines result from turn insulation breakdown. In some cases where there has been minimal or no core damage due to the fault, it is possible to isolate the damaged coil from the rest of the winding and restart the machine. Such an operation may necessitate isolation of other coils in order to retain balanced operation of the machine. In this way the machine can be returned to service quickly, albeit with degraded performance until a more complete repair or winding replacement can be scheduled. Unfortunately location of the failed coil is difficult and time consuming.

The object of the present invention is to provide a method of, and a device for, detecting the occurrence of a shorted turn and indicating its location in the stator winding of the machine while the machine is still running.

SUMMARY OF THE INVENTION

The device of the present invention takes advantage of the existence of axial leakage flux in practical rotating machines. In the ideal machine axial leakage flux does not exist since the currents flowing in rotor and stator circuits are equal but opposite in direction. However, in practice, asymmetries in the winding due to imperfections in construction and materials will result in a small imbalance between the rotor and stator currents. This imbalance will give rise to small but measurable axial flux harmonics which can be detected by a suitable sensor such as a coil placed concentric with the drive shaft of the machine.

From a knowledge of the equations describing the space harmonic distribution of magnetomotive forces in a stator winding and straightforward algebraic manipulation, one can predict mathematically which harmonic components of the axial leakage flux are present for a given winding. These are the harmonic components which are normally present in a "healthy" machine. Since these components result from asymmetries arising from small defects, fault conditions which are major asymmetries will give rise to a different set of flux components. Again by consideration of the magnetomotive forces due to the fault conditions these harmonic components can also be mathematically predicted. Each class of fault produces a unique set of axial flux harmonics. On the basis of these considerations, the method of the present invention can be summarized as follows, calculate, for a given winding, all time harmonics present during normal operation;

refer these harmonics to the stator frame of reference since the sensing coil is static;

derive the additional harmonics due to the occurrence of a shorted turn in the stator winding; and look for changes in these components to indicate the presence of an inter-turn fault.

Once the fault condition has been detected it is then necessary to be able to locate the position of the failed coil within the stator winding. The location method relies on the disruption of the end winding magnetic field symmetry due to the fault. This field asymmetry can be detected by a system of coils axisymmetrically displaced about the drive shaft. The magnitude of the magnetic field sensed by each of these coils can be related, using the Biot-Savart law, to the angular displacement of the fault position from the coil. Thus by using a number of coils the location of the fault can be derived using a triangulation technique. In this case only the rms value of the coil emf is required; there is no requirement to measure the harmonic components.

Specifically, the present invention provides a method of detecting and locating stator faults in a dynamoelectric machine by monitoring changes in axial leakage flux during operation of the machine. The method comprises:

Identifying the frequencies of selected harmonic components of axial leakage flux that are to be significantly affected by the occurrence of a stator fault, detecting the axial leakage flux at each of a plurality of positions, including a datum position, distributed symmetrically around the axis of the rotor adjacent to an end winding of the stator, deriving from the detected flux at each of said positions a first signal having a value corresponding to the magnitude of the detected flux, storing the values of said first signals derived prior to the occurrence of a stator fault, deriving from the detected axial leakage flux a further signal having a value corresponding to the magnitude of said selected harmonic components, monitoring said further signal and detecting a change therein thereby detecting the occurrence of a stator fault, storing the values of said first signals derived after the occurrence of the stator fault, comparing the values of said first signals stored before and after the occurrence of a stator fault and storing the differences therebetween, and determining from said comparison a value representing the angular position of the stator fault with respect to the datum position.

The occurrence of a stator fault representing a shorted turn is thus detected by monitoring selected axial flux harmonics which are sensitive to the occurrence. The angular position of the fault is computed from stored values, namely machine parameters which are initially known and measured values of the flux after detection of the fault.

BRIEF DESCRIPTION OF THE DRAWINGS

The preferred method according to the invention, and an apparatus therefor, will now be described by way of example with reference to the accompanying drawings. In the drawings.

DESCRIPTION OF THE PREFERRED EMBODIMENT

Basic Principles

Figure 1:
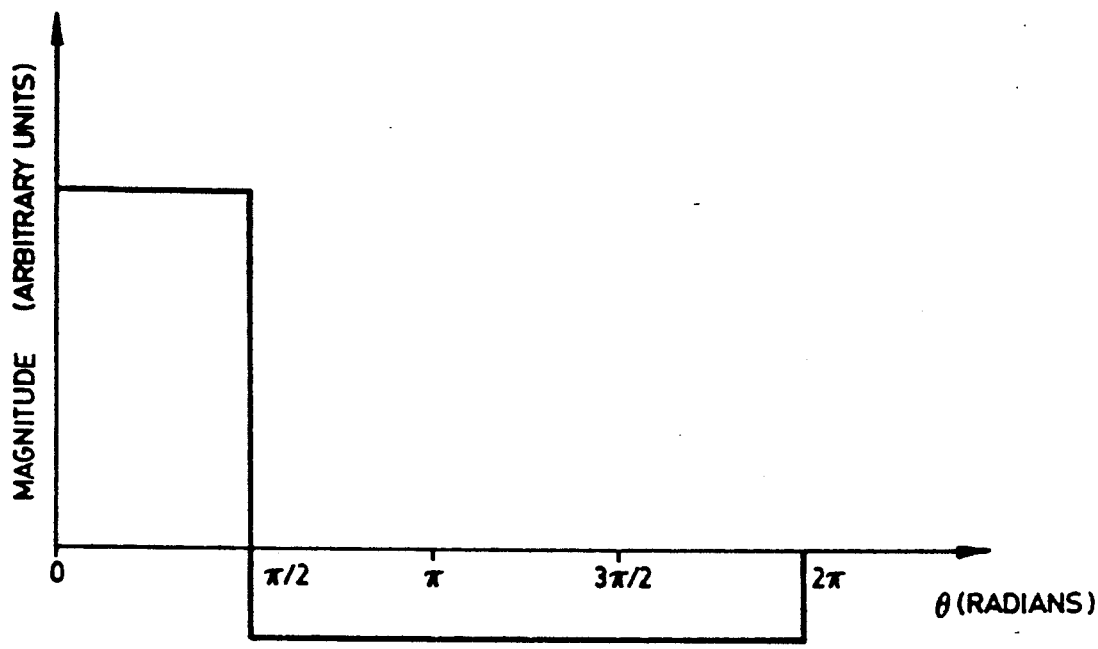
FIG. 1 is a graph showing the waveform of detected magnetomotive force (MMF) due to a shorted stator turn.

In the case of an ideal electrical machine there is zero net axial magnetic leakage flux because the stator and rotor currents should exactly cancel one another. However, in practice, due to nonuniformities in materials and construction methods, such a situation does not occur. Hence associated with all rotating machines there is a small, but measurable, axial leakage flux. This magnetic flux can be measured by the simple expedient of placing a search coil, or other appropriate magnetic flux sensing device, in close proximity to the end region of the machine. The output form such a device, when analyzed in the frequency domain, is manifest as a series of harmonics of varying magnitude. From basic electromagnetic considerations of electrical machines it is possible to derive expressions which permit the harmonic components inherent in the axial leakage flux to be predicted. The equations, which are simple algebraic expressions, only require knowledge of the number of poles and rotational speed of the machine, in order to calculate all possible harmonics for a particular machine.

The occurrence of a stator fault in an induction motor, for example, will inevitably result in a change in the air gap space harmonic distribution. These space harmonics cannot be detected directly by a search coil. However, the search coil can detect the time harmonics of the axial flux. Thus it is necessary to derive the relationship between the space and time harmonics in order to correctly interpret the frequency spectrum obtained from the search coil. For the purpose of this work, considering only the supply fundamental and the third harmonic component due to saturation, the space harmonic distribution of MMF due to a balanced, full pitched, three phase winding fed from a balanced supply frequency, $\omega$, is given by [1], $$m = 0.955 N_1 [k_{w1} \cos(\omega t - p\theta) + 0.2 k_{w5} \cos(\omega t + 5p\theta) - \qquad (1)$$

$$0.14 k_{w7} \cos(\omega t - 7p\theta) + 0.09 k_{w11} \cos(\omega t + 11p\theta) - \ldots ]$$

where $k_{wn}$ is the $n^{th}$ winding factor
p is the number of pole pairs
$\theta$ is the angular displacement from the stator datum This represents a rotating set of harmonics of order $6n \pm 1$ which can be simplified to the corresponding air gap fluxes, $$B_s = B_1 \cos(\omega t - p\theta) + B_5 \cos(\omega t + 5p\theta) - B_7 \cos(\omega t - 7p\theta)$$

$$+ B_{11} \cos(\omega t + 11p\theta) \qquad (2)$$

where $B_n$ are the spatial harmonic fluxes.

This expression is in the stator frame of reference. Consequently, because the shaft flux of the rotor is of interest, it is necessary to refer equation (2) to the rotor reference frame. Consider the situation in which $\beta$ is the angular displacement between the rotor and stator datum positions, and $\alpha$ is defined to be the angular displacement from the rotor datum. Then $\theta = \alpha + \beta$.

If the angular rotor speed is $\omega_r$, then, $$\theta = \alpha + \omega_r t \qquad (3)$$

now using the normal expression for the slip of the motor, i.e. $s = (\omega_s - \omega_r)/\omega_s$, where $\omega_s$, the synchronous speed, $= \omega/p$, $$\omega_r = \omega(1-s)/p \qquad (4)$$

Now, the general term of equation (2) is, $$B_{ns} = B_n \cos(\omega t \pm np\theta) \qquad (5)$$

substituting equations (3) and (4) into (5) leads to, $$B_{ns} = B_n \cos[(1 \pm n(1-s))\omega t \pm np\alpha] \qquad (6)$$

Expanding the expression for the first few terms gives, $$B_s = B_1 \cos(s\omega t - p\alpha) + B_5 \cos[(6 - 5s)\omega t + 5p\alpha] - \qquad (7)$$

$$B_7 \cos[7s - 6)\omega t - 7p\alpha] + B_{11} \cos[(12 - 11s) + 11p\alpha] - \ldots$$

Equation (7) gives the frequency components of the currents that are induced in the rotor due to the air gap space harmonics of a balanced winding and supply. In addition to these harmonics, the fundamental of the supply frequency will also appear in the axial flux spectrum. The presence of additional, higher order, harmonics can be accounted for by using the term $n\omega$ rather than $\omega$.

Having derived the harmonic components of axial flux due to asymmetries in a "healthy" machine, the situation in which an interturn short circuit is introduced is now considered. The effect of the interturn fault is to remove a turn from the stator winding. This will have a small, but finite, effect on the main air gap flux distribution. In addition, an emf will be induced in the shorted turn which will result in a current flow limited only by the self impedance of the fault. This impedance essentially determines the transition time between turn and groundwall insulation failure.

The fault current due to the shorted turn is the source of an additional MMF pulse. This MMF pulse also has a space harmonic distribution which is superposed on the main field distribution. From previous considerations, this will lead to a change in the time harmonics observed in the leakage field. The changes to be expected can also be predicted mathematically, as follows:

Simple consideration of the MMF distribution due to an interturn short circuit leads to the characteristic illustrated in FIG. 1. This is the case for a four pole machine. The analysis to be outlined below is for the general case of a 2p pole machine. Fourier analysis of the MMF waveform, illustrated in FIG. 1, shows that it contains all harmonics except the fourths, i.e., $$B_s = 0.5 \Sigma B_n \cos(\omega t \pm n\theta), n \neq 4m, \text{ all } m \qquad (8)$$

For the general case, the corresponding waveform would have a mark-space ratio of 1:(2p−1) causing every $2p^{th}$ harmonic to be absent. Hence the time harmonics produced by the rotor are given by, $$B_s = 0.5 \Sigma B_n \cos[(1 \pm n(1-s)/p)\omega t \pm n\alpha], \quad n \neq 2pm \quad (9)$$

Adding in supply time harmonics of higher order k, leads to the completely general expression, $$B_s = 0.5 \Sigma B_n \cos[(k \pm n(1-s)/p)\omega t \pm n\alpha], \quad n \neq 2pm \quad (10)$$

Although this is a large series, only the lower order harmonics are significant. The key element of this expression is, $$[k \pm n(1-s)/p]f_1 \quad (11)$$

for k=1,3 and n=1,2,3,..........,(2p−1)

The $n\alpha$ term in the argument of (10) causes the components defined above to beat at the slip frequency of the rotor current.

Thus the following procedure can be employed to identify the stator fault:
1. Calculate air gap space harmonics due to balanced supply and winding conditions.
2. Derive associated time harmonic currents (fluxes) in rotor and stator reference frames.
3. Refer all time harmonic components to the stator frame, since the search coil is stationary. These are the components to be expected in the "healthy" machine.
4. Calculate additional space harmonics injected by the occurrence of an interturn short circuit.
5. Relate these to additional time harmonics in the spectrum of the axial field.
6. Look for changes in these components, which can be predicted for a given machine, to indicate the presence of an interturn fault.

Having determined that a stator fault condition exists, the next task is to locate the position of the fault within the stator winding. The introduction of a shorted turn in the stator winding produces an asymmetry in the magnetic field in the endwinding of the machine. This is because the short circuit current flowing in the fault is not balanced by an equal current flowing in the corresponding phase belt which is situated diametrically opposite the faulted turn. Thus, by measuring the asymmetry in the endwinding magnetic field the position of the faulted coil within the stator winding can be determined.

Figure 2:
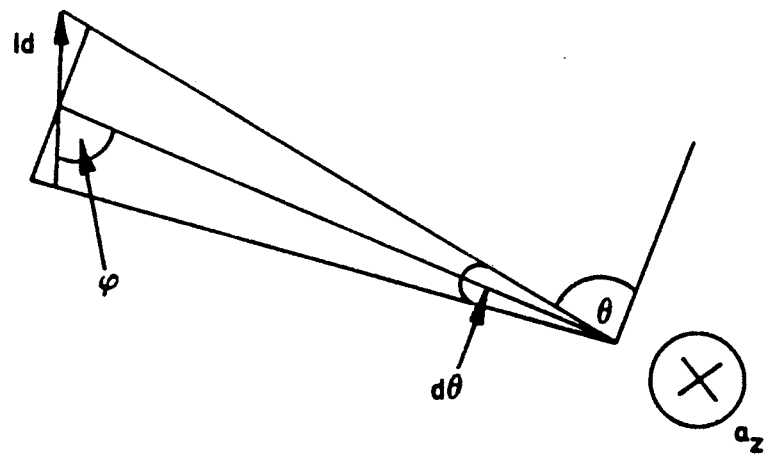
FIGS. 2 and 3 are diagrams illustrating the geometric considerations required in magnetic field calculation.

The technique relies upon the use of an array of at least four search coils, or other appropriate sensors, distributed axisymmetrically about the drive shaft of the motor. These coils provide a local measure of the magnetic field in the end region of the machine. By triangulating the outputs from the search coils, it is possible to determine the location of the stator coil containing the interturn short circuit. In order to accomplish this function it is necessary to develop an expression for the field at any point on the circumference of the circle passing through the centres of the search coils due to the current flowing in the end winding of an arbitrarily positioned turn of the stator winding. By invoking the Biot-Savart law and with reference to FIG. 2, one can deduce $$d\underline{B} = (\mu \cdot I \times a_z)/4\pi r^2 \quad (12)$$

where
$\underline{B}$ is the magnetic field strength vector
$\mu$ is the permeability of free space
aHD z is the unit vector in the z direction
From FIG. 2, and rewriting equation (12)

$$d\underline{B} = (\mu \cdot I dl \sin\phi)/4\pi r^2 \quad (13)$$

but since $dl\sin\phi = r d\theta$,
$$dB = (\mu \cdot I d\theta)/4\pi r \quad (14)$$

Figure 3:
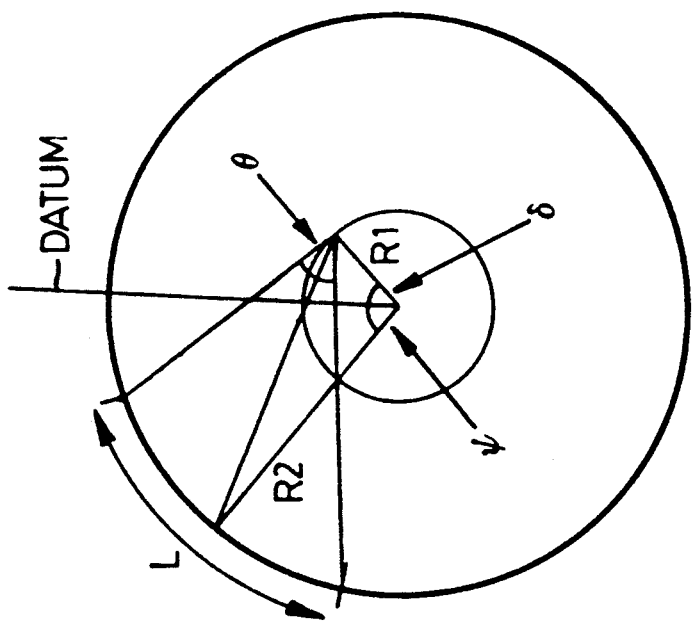

FIG. 3 illustrates the general case in which the shorted turn is displaced an angular amount $\psi$, from an arbitrary datum position. In this case $R_2$ is the mean radius of the end winding, and $R_1$ is the radius of the circle on which the field is to be calculated. The circles are assumed to be coplanar and concentric. The length of arc of the coil is L and the field measurement point is displaced an angle $\delta$ from the datum. Using the cosine rule, $$r^2 = R_1^2 + R_2^2 - 2R_1 R_2 \cos(\psi + \delta) \quad (15)$$

If $R_2$ is very much greater than $R_1$, then $L \approx r\theta$, thus $$\theta = L/[R_1^2 + R_2^2 - 2R_1 R_2 \cos(\psi + \delta)]^{0.5} \quad (16)$$

From equations (14) and (16), the value of B at the field point is given by, $$B = \mu_2 0 IL/[4\pi(R_1^2 + R_2 R^2 - 2R_1 R_2 \cos(\psi + \delta))] \quad (17)$$

By fixing the position of a number of coils with respect to the datum, and arbitrarily assigning a reference coil at $\delta = 0$, the value of B at each coil can be found as a function of $\psi$. From the measured values of B, $\psi$ can be found and consequently the position of the faulted turn.

Figure 4:
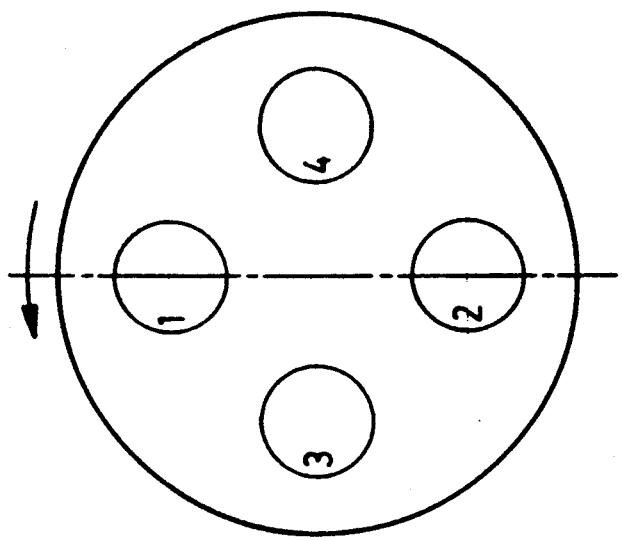
FIG. 4 is a diagram illustrating the geometry of sensors used to detect axial leakage flux.

In order to optimize the detection scheme, it is necessary to determine the minimum number of coils required for simple and reliable fault location. Consider the situation in which two coils are spaced 180° apart. Each coil will have an induced emf, proportional to the flux linking it. With reference to FIG. 4, and taking the coil at position 1 to be the datum, from equation (17), $$B_1 = k/(a - b\cos\psi) \quad (18) \text{ and}$$

$$B_2 = k/(a - b\cos(\psi + 180°)) \quad (19)$$

$$\text{thus } B_2 = k/(a + b\cos\psi) \quad (20)$$

where
$k = \mu \cdot IL/4\pi$
$a = (R_1^2 + R_2^2)$
$b = 2R_1 R_2$

From equations (18) and (20), and some rearrangement of the terms, $$\cos\psi = [a(B_1 - B_2)]/[b(B_1 + B_2)] \quad (21)$$

This expressions locates the fault to within $\pm\psi$ because, $$\pm\psi = \cos^{-1}[0.5(R_1/R_2 + R_2/R_1)\{(B_1 + B_2)/(B_1 + B_2)\}] \quad (22)$$

In practice the measured values of the emf induced in the coils can be used because the B values are ratioed in equation (22).

Consequently the values used when attempting fault location should be the modulus of the difference between the "healthy" and "faulted" conditions. In order to locate uniquely the fault, a second set of coils, 3 and 4, is required, as shown in FIG. 4. For convenience they are displaced at right angles to the axis of symmetry of coils 1 and 2. However, the angular displacement of the coils is not critical. Repeating the location procedure in the same fashion as above with the second set of coils, will yield $\pm\psi_{p2}$, which differentiates it from $\pm\psi_{p1}$, found from coils 1 and 2. If the higher magnitude coil signal is chosen as the point from which to measure, then $\psi$ will always fall within the range of 0° to 90°. In addition, only one quadrant will contain an angular position identified using both sets of coils. This is the approximate location of the fault.

In order to clarify the procedure for locating the position of a faulted coil within the stator winding, reference should be made to FIG. 4. For the purpose of the location algorithm, the coils are grouped in pairs, in this case coils 1 and 2 form one pair, and coils 3 and 4, the other pair.

Initially, at a point in time at which the motor is considered to be healthy, the induced emf value on each of the coils is measured and recorded. In the event of an interturn short circuit occurring, the emf values on each of the coils are again recorded. These latter values are subtracted from the initial values and the modulus of the resultant is taken. Subsequently, the four positive numbers thus derived, i.e. $B_1$, $B_2$, $B_3$ and $B_4$, are input into the fault location algorithm. This operation results in two expressions, $$\pm\psi_{p1} = \cos^{-1}[0.5(R_1/R_2 + R_2/R_1)((B_1-B_2)/(B_1+B_2))]$$

and, $$\pm\psi_{p2} = \cos^{-1}[0.5(R_1/R_2 + R_2/R_1)((B_3-B_4)/(B_3+B_4))]$$

The resultants from these expressions are angles. The reference points are taken as the coils, in each pair, upon which the largest emf value was recorded. Thus, if for example, coil 1 had the largest reading between coils 1 and 2, one would say that the position of the fault was $\pm\psi_{p1}$ from coil 1. Similarly, if the reading on coil 4 was the larger of the readings on coils 3 and 4, the fault would be located $\pm\psi_{p2}$ from coil 4. Hence, it is a simple step to draw the conclusion that, in this case the fault must lie in the quadrant between coils 1 and 4 at the angular position $\psi_{p1}-\psi_{p2}/2$.

To summarize, the detection and location scheme is as follows:
- from machine parameters calculate the axial leakage flux components under normal conditions
- calculate which of the harmonics will change as the result of an interturn short circuit
- search for these components in the axial leakage field of the machine
- indication apply the fault location technique described above

IMPLEMENTATION OF THE METHOD

Figure 5:
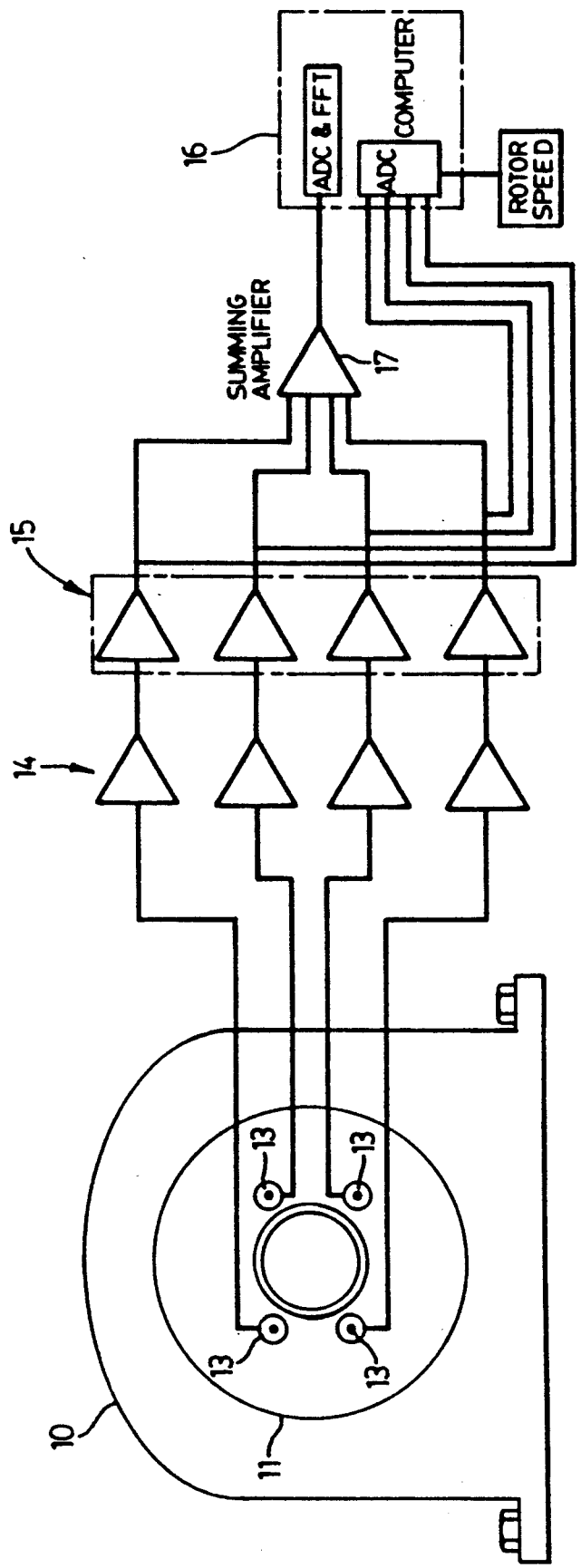
FIG. 5 is a partially diagrammatic illustration of an apparatus used to monitor axial leakage flux.

FIG. 5 illustrates a preferred apparatus used to detect and locate the occurrence of a shorted turn of the stator winding 11 of an induction motor 10 by monitoring changes in the axial leakage flux during operation of the motor. The apparatus comprises two subsystems, namely means for sensing the axial leakage flux and means for processing the signals derived therefrom. A further subsystem, which may be necessary in some cases, is some form of speed measurement in order to gain a measure of the slip of the motor when loaded.

The flux sensors shown in FIG. 5 are air cored coils 13, which are inexpensive and easily fabricated. The preferred location of the search coils is axisymmetric with the drive shaft of the motor, either inside or outside the motor casing. In the illustrated embodiment there are four search coils 13 distributed symmetrically around the axis of the motor adjacent to an end winding of the stator 11. In principle there could be more than four search coils, but the use of four search coils arranged as diametrically opposed pairs simplifies the signal processing procedures and circuitry.

Speed measurement, if required, can be accomplished in a number of ways. In some cases, speed information is available at the motor control centre in the plant. However, it is possible that some type of transduction system may be necessary. A measure of the rotational speed of the rotor is needed in order to calculate the slip of the motor. The slip is required because the harmonics of the axial leakage flux are dependent on the slip of the motor. Rotational speed can easily be obtained by measuring the time required for a reference point on the drive shaft to complete one revolution. In practice this can be done by painting a stripe on the drive shaft and using a device such as a photo transistor to generate an electrical pulse each time the stripe passes under the photo transistor.

It is necessary to condition the voltage signals derived from the search coils, which are normally of only a few millivolts. In order to bring these signals to more manageable levels they are amplified by preamplifiers 14. Furthermore, in order to remove the power frequency component, which is relatively high and likely to saturate subsequent amplifier stages, the signals are filtered by power frequency notch filters 15. Alternatively, very wide dynamic range amplifiers may be used. The four analogue signals, after conditioning, are digitized to produce respective "first" signals having magnitudes corresponding to the harmonic flux detected by the four search coils 13. These "first" signals are subsequently processed by a computer 16 as hereinafter described, to determine the angular position of a detected stator fault.

The analogue signals from the notch filters 15 are also summed by a summing amplifier 17, the summed signal then being digitized. This summed signal must now be decomposed into its harmonic components. Two practical approaches to this task are possible. Given that the components of the axial leakage flux are mathematically predictable, a set of filters, tuned to the frequencies of interest, can be used. The outputs of these filters can be monitored for changes which potentially indicate the onset of a fault condition. In practice, in view of the variety of motor designs which exist, construction of discrete filters tailored to the motor parameters is not a practical approach. However, by using digitally controlled analogue filters, it is possible to set up an array of filters which can be readily customized to the particular motor. For example, a single controllable filter may be sequentially stepped through the predetermined frequencies of interest.

The preferred method, according to the present invention, of decomposing the signal into its harmonic components is to digitize the signal from the summing amplifier 17 and to transform the digital signal to the frequency domain by means of a fast Fourier transform (FFT). In this way, a further signal having a value corresponding to the magnitude of selected harmonic components of axial leakage flux is derived. The harmonic components are selected as being those which are significantly affected by the occurrence of a stator fault.

The method of the present invention will now be described with reference to FIGS. 6 and 7.

In order to detect the occurrence of a stator fault by monitoring changes in the axial leakage flux, it is first necessary to identify the frequencies of the harmonic components which are significantly affected by the occurrence. These can be calculated from the machine parameters and the conditions under which the motor is operating.

Figure 6:
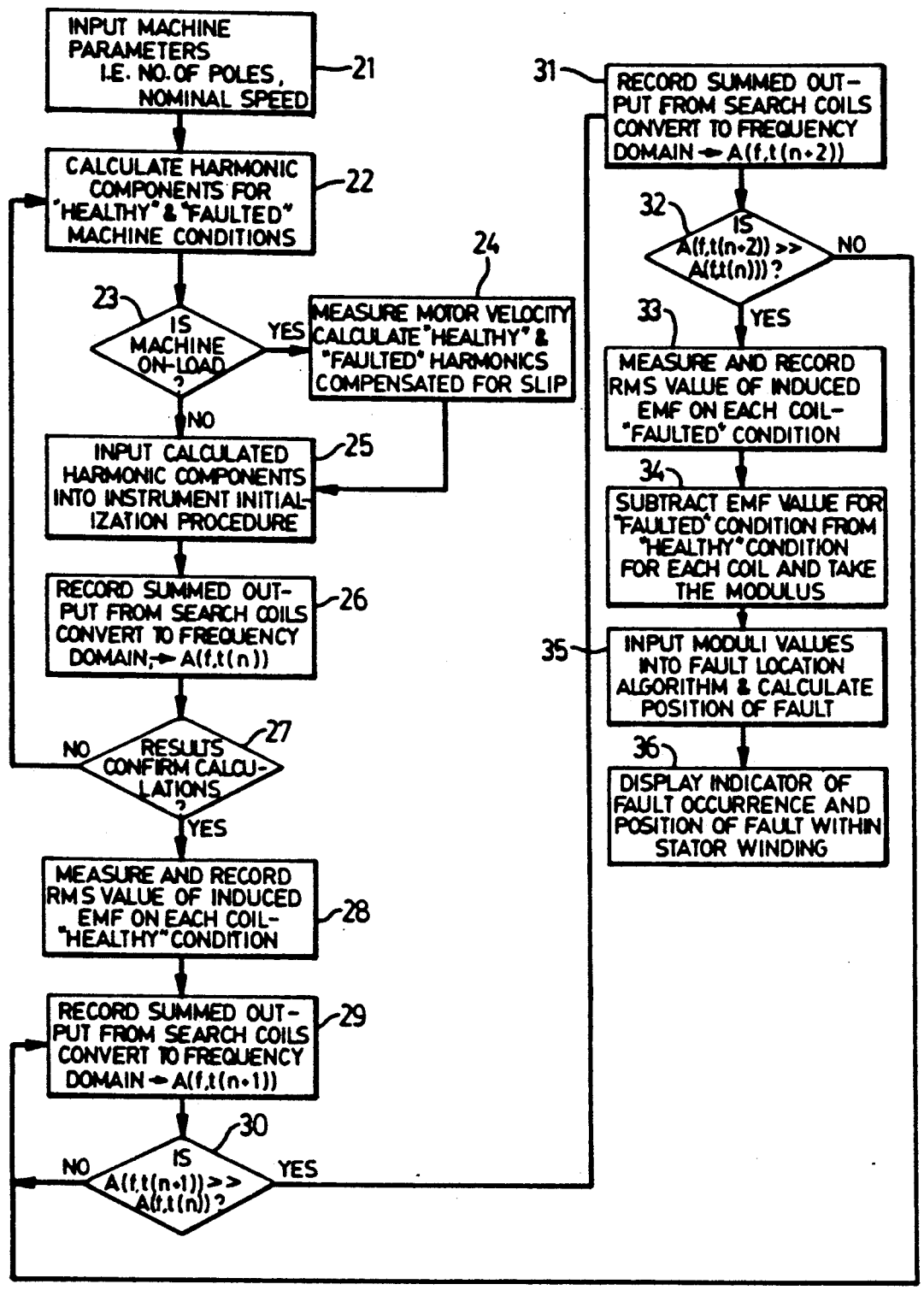
FIG. 6 is a diagram illustrating the general algorithm used to detect and locate a stator fault.

Referring to FIG. 6, the first thing to do is to input into the computer the relevant input parameters specifically the number of poles of the motor and its nominal speed (BLOCK 21). From these parameters the harmonic components of axial leakage flux under faulted and no-fault conditions are computed (BLOCK 22). If the motor is on-load (BLOCK 23), the rotor velocity has to be taken into account (BLOCK 24); in either case the results of the calculation are input into the initialization procedure (BLOCK 25). The summed outputs from the search coils are recorded at a first period $t(n)$ and converted to the frequency domain, $\rightarrow A(f,t(n))$ (BLOCK 26) as previously described. The results are tested (BLOCK 27 and should confirm the calculations of (BLOCK 23).

The next step in the procedure is to measure and record the summed output of induced emf on each of the search coils at a second period $t(n+1)$, and converted to the frequency domain, $\rightarrow A(f,t(n+1))$ (BLOCK 29). If a possible fault is detected by applying the test $$A(f,t(n+1)) >> A(f,t(n)) \quad \text{(BLOCK 30)}$$

then the summed output from the search coils is measured and recorded at a third period and converted to the frequency domain, $\rightarrow A(f,t(n+2))$ (BLOCK 31). The possible fault is confirmed or ignored by testing whether $$A(f,t(n+2)) >> A(f,t(n)) \quad \text{(BLOCK 32)}$$

If the result is positive, the fault is confirmed; otherwise it can be taken that the apparent fault was due to a temporary or spurious event.

If the fault is confirmed, the rms value of induced emf in each of the search coils in the faulted condition of the motor is measured and recorded, (BLOCK 33). The emf value for the faulted condition is subtracted from the stored emf value for the healthy condition, for each search coil, and the modulus of the difference is taken (BLOCK 34). From the moduli value so obtained the angular position of the fault with respect to a datum position can be calculated, (BLOCK 35), as will be described with reference to FIG. 7. The occurrence of the stator fault, and its position in the stator winding, are then displayed (BLOCK 36).

Upon confirmation of the occurrence of a stator fault (BLOCK 32), the angular position of the fault is determined by using the algorithm illustrated in FIG. 7, This algorithm involves the use of values derived from signals obtained after the occurrence of the fault, as will now be described, as well as the following values:

$R_1 =$ radius of the circle on which the axes of the search coils lie, this value having been entered and stored initially;

$R_2 =$ mean radius of the end winding of the stator, this value having been entered and stored initially;

EMF (healthy) = the values of said "first" signals derived from the search coils, these values having been stored prior to the occurrence of the fault.

Figure 7:
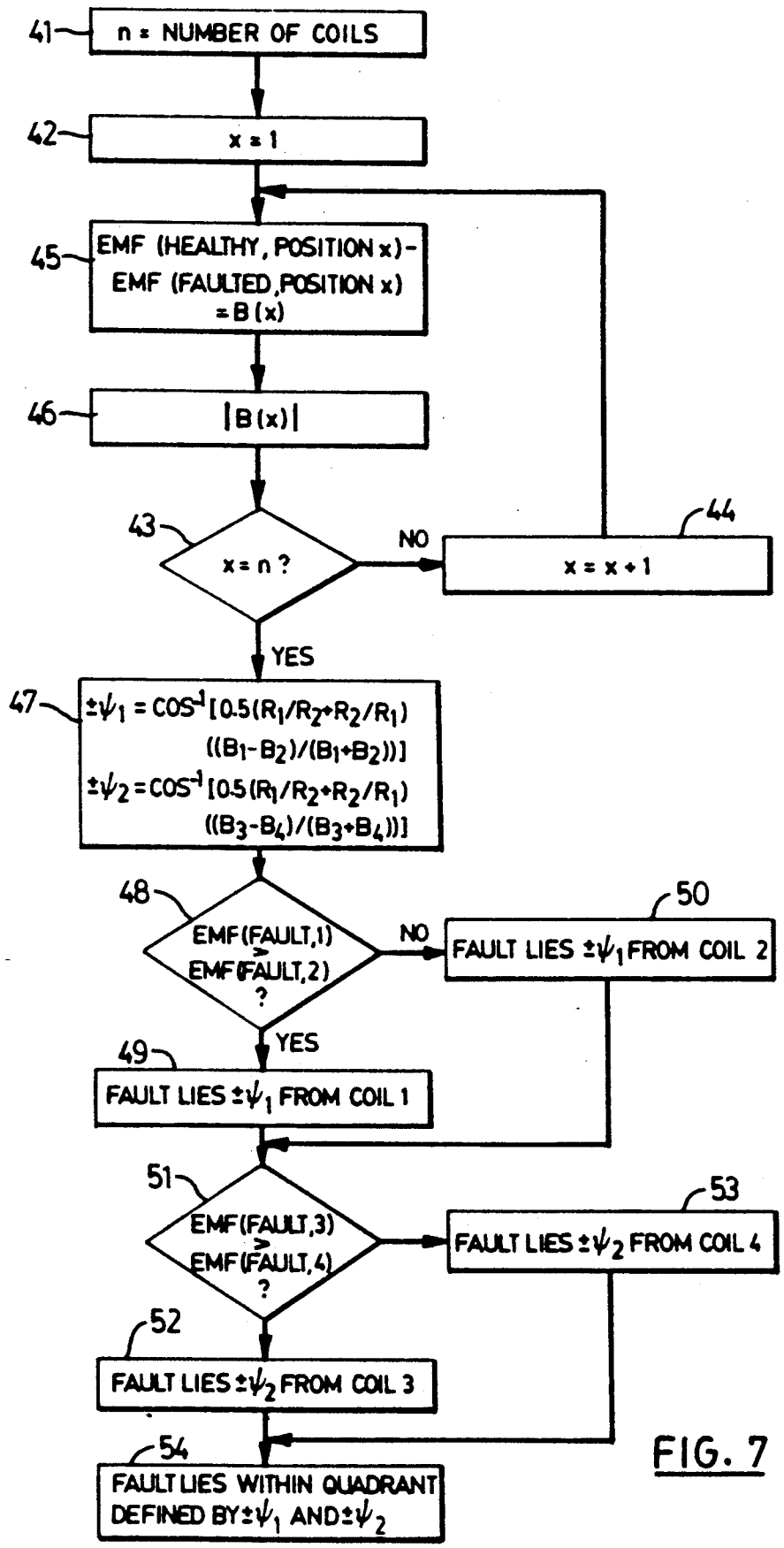
FIG. 7 is a diagram illustrating the detailed algorithm used to locate the stator fault.

Referring to FIG. 7, the number of search coils n was previously entered into the computer and stored (BLOCK 41). In the present example $n=4$, and in the algorithm the individual search coils are identified by the letter x, where $x=1$, $x=2$, $x=3$ and $x=4$, respectively.

The signals from the search coils, previously referred to as the "first" signals, are examined in turn, (BLOCKS 42, 43, 44). The "first" signal from each of the search coils corresponds to the axial leakage flux detected by the search coil, being derived from the voltage signal which is a measure of the rms value of the emf induced in the coil. The value of this signal, denoted by EMF (faulted, position x), is subtracted from the previously stored value of the signal EMF(healthy, position x), (BLOCK 45), and the modulus $|B(x)|$ is taken (BLOCK 46).

The computer now has in store all the necessary values and parameters from which the angular position of the stator fault can be computed, namely $R_1$, $R_2$, $B_1$, $B_2$, $B_3$, $B_4$. From these values the following relationships are derived, (see BLOCK 47):

$$\pm\psi_1 = \cos^{-1}[0.5(R_1/R_2 + R_2/R_1)(B_1-B_2)/(B_1+B_2)]$$

$$\pm\psi_2 = \cos^{-1}[0.5(R_1/R_2 + R_2/R_1)(B_3-B_4)/(B_3+B_4)]$$

Since $\psi = \psi_2 + 90°$, the required angular position of the fault $\psi_o$, can be determined. In other words the quadrant in which the fault lies can be readily determined.

Thus, considering the first pair of diametrically opposed search coils 1, 2, one must determine whether EMF(fault, 1) is greater or less than EMF(fault, 2), (BLOCK 48). If it is greater, then the fault is at one of the positions $\pm\psi_1$ from coil 1,(BLOCK 49). If it is less, then the fault is at one of the positions $\pm\psi_1$ from coil 2, (BLOCK 50). In order to resolve the ambiguity, one must now determine whether EMF(fault, 3) is greater or less than EMF(fault, 4), (BLOCK 51). If it is greater, then the fault is at a position $\pm\psi_2$ from coil 3, (BLOCK 52), while if it is less, the fault is at one of the positions $\pm\psi_2$ from coil 4, (BLOCK 53). The fault obviously lies within the quadrant defined by $\pm\psi_1$ and $\pm\psi_2$, (BLOCK 54); that is to say, the angular position $\psi_o$ of the fault with respect to the datum position is given by $$\psi_o = \psi_1 = \psi_2 + 90°.$$

This position is displayed along with indication that a fault has occurred.

We claim:

1. A method of detecting and locating stator faults in a dynamoelectric machine having a rotor and a stator with multiturn stator coils by monitoring changes in axial leakage flux during operation of the machine, comprising identifying the frequencies of selected harmonic components of axial leakage flux that are to be significantly affected by the occurrence of a stator fault, detecting the axial leakage flux at each of a plurality of positions, including a datum position, distributed symmetrically around the axis of the rotor adjacent to an end winding of the stator, deriving from the detected flux at each of said positions a first signal having a value corresponding to the magnitude of the detected flux, storing the values of said first signals derived prior to the occurrence of a stator fault, deriving from the detected axial leakage flux a further signal having a value corresponding to the magnitude of said selected harmonic components, monitoring said further signal and detecting a change therein thereby detecting the occurrence of a stator fault, storing the values of said first signals derived after the occurrence of the stator fault, comparing the values of said first signals stored before and after the occurrence of a stator fault and storing the differences therebetween, and determining from said comparison a value representing the angular position of the stator fault with respect to the datum position.

2. A method according to claim 1, wherein the storage of said first signals derived after the occurrence of a stator fault is initiated by the detection of the fault.

3. A method according to claim 2, wherein the axial leakage flux is detected at each of four positions, including said datum position, distributed symmetrically around said axis.

4. A method according to claim 3, wherein the determination of said value representing the angular position of the stator fault comprises:

storing a value $R_1$ representing the radial distance of said four positions from the axis of the stator, storing a value $R_2$ representing the mean radius of the stator end winding, computing values $B_1$ and $B_2$ corresponding respectively to the moduli of said differences between the stored values of said first signals derived from the detected flux at one diametrically opposed pair of said flux detecting positions, computing values $B_3$ and $B_4$ corresponding respectively to the moduli of said differences between the stored values of said first signals derived from the detected flux at the other diametrically opposed pair of said flux detecting positions, and computing values $\psi_1$ and $\psi_2$, where $$\pm\psi_1 = \cos^{-1}[0.5(R_1/R_2 + R_2/R_1)(B_1 - B_2)/(B_1 + B_2)]$$

$$\pm\psi_2 = \cos^{-1}[0.5(R_1/R_2 + R_2/R_1)(B_3 - B_4)/(B_3 + B_4)]$$

determining therefrom the angular position of the stator fault $\psi_o$ with respect to said datum position from the relationship $$\psi_o = \psi_1 = \psi_2 + 90°$$

and displaying the value $\psi_o$.

5. A method according to claim 4, wherein the spectrum of axial leakage flux is analysed by deriving a respective voltage signal corresponding to the detected leakage flux at each of said plurality of positions, summing the derived voltage signals, digitizing the sum of said voltage signals, and transforming the digitized signal to the frequency domain by means of a fast Fourier transform

* * * * *